(12) United States Patent
Nomachi (10) Patent No.: US 7,875,512 B2
(45) Date of Patent: Jan. 25, 2011

(54) METHOD FOR MANUFACTURING SEMICONDUCTOR DEVICE

(75) Inventor: Akiko Nomachi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/355,144

(22) Filed: Jan. 16, 2009

(65) Prior Publication Data

US 2009/0186472 A1 Jul. 23, 2009

(30) Foreign Application Priority Data

Jan. 21, 2008 (JP) ............................. P2008-010344

(51) Int. Cl.
*H01L 21/8238* (2006.01)
(52) U.S. Cl. .................. 438/199; 438/197; 438/207; 438/218; 438/220; 438/221; 257/E27.046; 257/E27.064; 257/E27.108; 257/E21.632
(58) Field of Classification Search ................. 438/197, 438/199, 207, 218, 220, 221; 257/E27.046, 257/E27.064, E27.108, E21.632
See application file for complete search history.

(56) References Cited

U.S. PATENT DOCUMENTS

| 6,251,729 | B1 * | 6/2001 | Montree et al. ............. 438/257 |
| 6,737,309 | B2 * | 5/2004 | Matsuo ....................... 438/199 |
| 2005/0282326 | A1 | 12/2005 | Gilmer et al. | |
| 2006/0166427 | A1 * | 7/2006 | Akasaka ..................... 438/199 |

2007/0077698 A1 4/2007 Gilmer et al.

FOREIGN PATENT DOCUMENTS

JP 2002-329794 11/2002

OTHER PUBLICATIONS

Schram, et al., "Novel Process To Pattern Selectively Dual Dielectric Capping Layers Using Soft-Mask Only", Symposium on VLSI Technology Digest of Technical Papers, pp. 44-45, (2008).
Kadoshima, et al., "Fermi-level pinning position modulation by Al-containing metal gate for cost-effective dual-metal/dual-high-k CMOS", Symposium on VLSI Technology Digest of Technical Papers, pp. 66-67, (2007).
Sivasubramani, et al., "Dipole Moment Model Explaining nFET $V_t$ Tuning Utilizing La, Sc, Er, and Sr Doped HfSiON Dielectrics", Symposium on VLSI Technology Digest of Technical Papers, pp. 68-69, (2007).

* cited by examiner

*Primary Examiner*—Michelle Estrada
(74) *Attorney, Agent, or Firm*—Finnegan, Henderson, Farabow, Garrett & Dunner, L.L.P.

(57) ABSTRACT

According to an aspect of the present invention, there is provided a method for manufacturing a semiconductor device, the method including: forming a first region and a second region in a semiconductor substrate by forming an element isolation region; forming an insulating film on the semiconductor substrate in the first region and the second region; forming a first metal film on the insulating film in the first region and in the second region; removing the first metal film in the second region; forming a second metal film on the first metal film in the first region and on the insulating film in the second region; and flattening top surfaces in the first region and the second region by performing a flattening process.

19 Claims, 6 Drawing Sheets

METHOD FOR MANUFACTURING SEMICONDUCTOR DEVICE

CROSS-REFERENCE TO RELATED APPLICATIONS

This application claims priority from Japanese Patent Application No. 2008-010344 filed on Jan. 21, 2008, the entire contents of which are incorporated herein by reference.

BACKGROUND OF THE INVENTION

1. Field of the Invention

An aspect of the present invention relates to a method for manufacturing a semiconductor device and more particularly to a method for manufacturing a CMISFET (Complementary Metal Insulator Semiconductor Field Effect Transistor) using a metal gate electrode.

2. Description of the Related Art

As the downscaling of the CMIFET progresses, a depletion caused by use of a polysilicon electrode gate becomes a problem, and a metal gate electrode has been used.

In a metal gate electrode structure, a threshold of a transistor is determined by an impurity concentration in a channel region and a work function of a gate electrode material. Therefore, in a dual metal gate structure, it is desired to use a metal gate material having an optimum work function for each of an n type MISFET (which will be hereinafter referred to as an nMIS) and a p type MISFET (which will be hereinafter referred to as a pMIS) (for example, see JP-2002-329794-A).

However, there has not been developed a practical method for respectively fabricating metal gate electrodes having optimum work functions for the nMIS and pMIS. It is desired to develop the practical method.

SUMMARY OF THE INVENTION

According to an aspect of the present invention, there is provided a method for manufacturing a semiconductor device, the method including: forming a first region and a second region in a semiconductor substrate by forming an element isolation region; forming an insulating film on the semiconductor substrate in the first region and the second region; forming a first metal film on the insulating film in the first region and in the second region; removing the first metal film in the second region; forming a second metal film on the first metal film in the first region and on the insulating film in the second region; and flattening top surfaces in the first region and the second region by performing a flattening process.

According to another aspect of the present invention, there is provided a method for manufacturing a semiconductor device, the method including: forming a first region and a second region in a semiconductor substrate by forming an element isolation region; forming an insulating film on the semiconductor substrate; forming a first cap film on the insulating film; forming a first metal film on the first cap film; removing the first metal film and the first cap film in the second region; forming a second metal film on the first metal film in the first region and on the insulating film in the second region; and flattening top surfaces in the first region and the second region by performing a flattening process.

According to still another aspect of the present invention, there is provided a method for manufacturing a semiconductor device, the method including: forming a first region and a second region in a semiconductor substrate by forming an element isolation region; forming an insulating film on the semiconductor substrate; forming a first metal film on the insulating film; removing the first metal film in the second region; forming a second cap film on the first metal film in the first region and on the insulating film in the second region; forming a second metal film on the second cap film; and flattening top surfaces in the first region and the second region by performing a flattening process so that the second cap film is removed in the first region.

DETAILED DESCRIPTION OF THE INVENTION

Manufacturing Method Tried by the Inventor

A comparative-example method for respectively fabricating different metal gates for an nMIS and a pMIS by using a first lithography for opening only a pMIS region and a second lithography for opening only an nMIS region which has been tested by the inventor will be described with reference to FIGS. 4A to 5E.

Figure 4A:
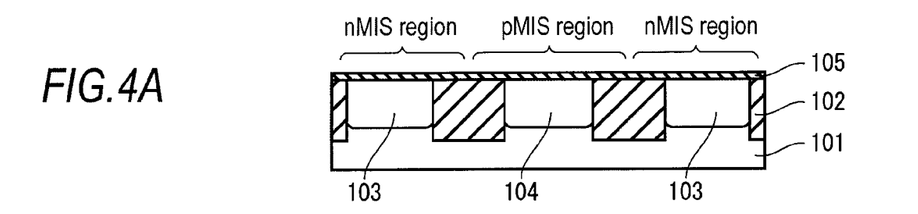
FIGS. 4A to 4E illustrate a method for manufacturing a semiconductor device according to a comparative example.
Figure 4B:
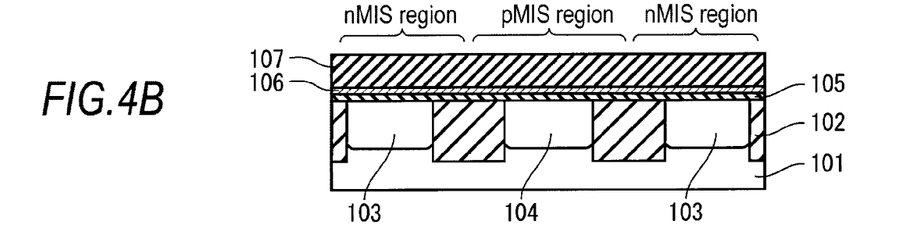

As shown in FIG. 4A, a gate insulating film 105 is formed on a p well 103 to be an nMIS region and an n well 104 to be a pMIS region which are isolated by an STI (Shallow Trench Isolation) 102 over a silicon substrate 101. Next, as shown in FIG. 4B, a first metal gate material such as a titanium nitride film 106, which is suitable for the nMIS, is formed on the gate insulating film 105, and a silicon nitride film 107 to be a first hard mask material is formed on the titanium nitride film 106.

Figure 4C:
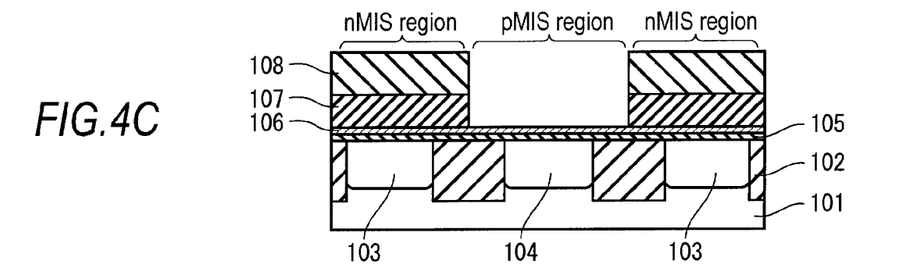

Then, as shown in FIG. 4C, a resist 108 is formed on the silicon nitride film 107, an opening for exposing the pMIS region is formed on the resist 108 by a lithography technique (a first lithography) so that the resist 108 is used as a mask to remove the silicon nitride film 107 on the pMIS region through an etching technique, thereby forming a first hard mask.

Figure 4D:
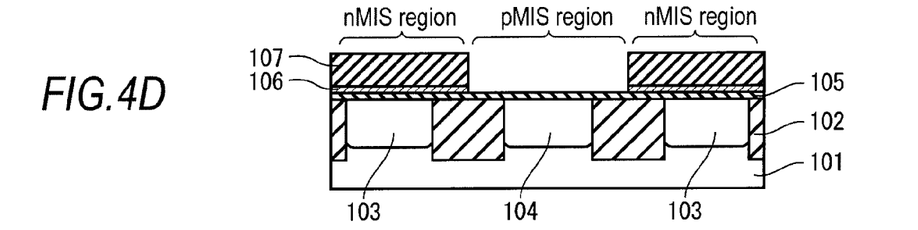

Subsequently, as shown in FIG. 4D, the resist 108 is removed, and the titanium nitride film 106 on the pMIS region is removed by etching using the first hard mask 107 as a mask.

Figure 4E:
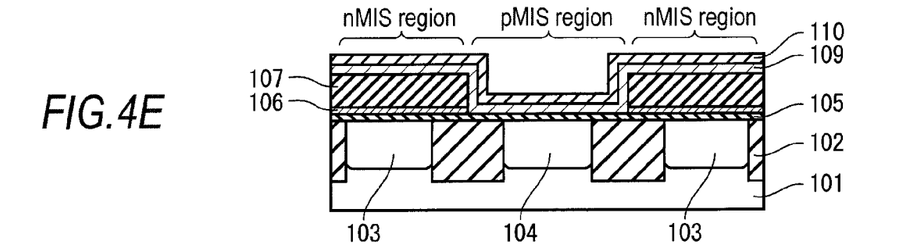

Next, as shown in FIG. 4E, a second metal gate material such as a tungsten film 109, which is suitable for the pMIS, is formed on the gate insulating film 105 provided on the pMIS region and the silicon nitride film 107 provided on the nMIS region, and a silicon nitride film 110 to be a second hard mask is laminated on the tungsten film 109.

Figure 5A:
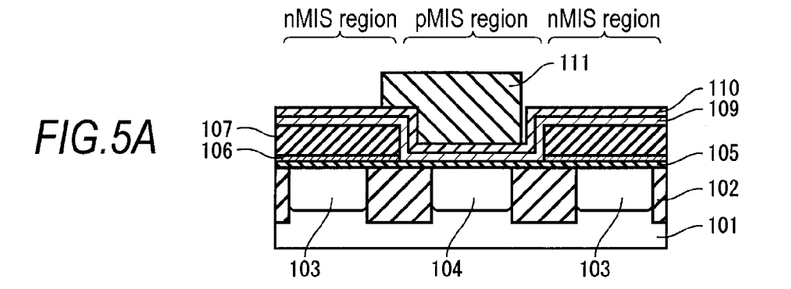
FIGS. 5A to 5E illustrate the method according to the comparative example.
Figure 5B:
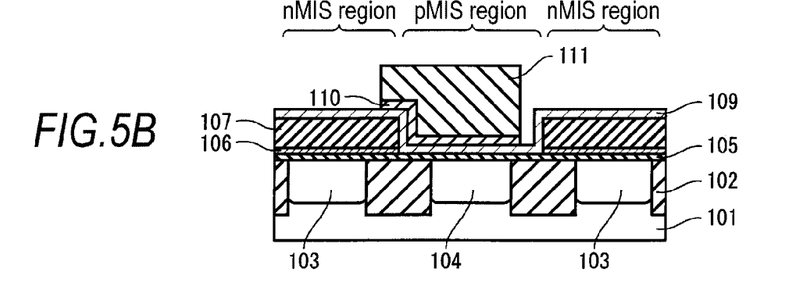

Thereafter, as shown in FIG. 5A, a resist 111 is formed on the silicon nitride film 110, and an opening for exposing the nMIS region is formed on the resist 111 by a lithography technique (a second lithography) Subsequently, as shown in FIG. 5B, the resist 111 is used as a mask to remove the silicon nitride film 110 in the nMIS region by an etching technique, thereby forming the second hard mask.

Figure 5C:
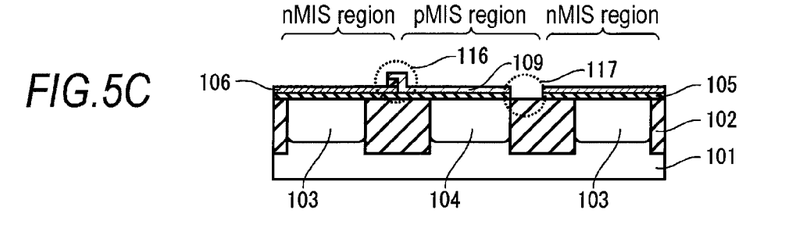

Subsequently, as shown in FIG. 5C, the resist 111 is removed, and the tungsten film 109 on the nMIS region is removed by etching using the second hard mask 110 as a mask. Thereafter, the first and second hard masks 107 and 110 are removed.

Figure 5D:
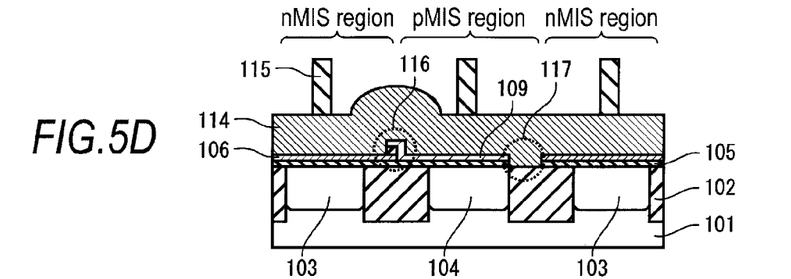

As shown in FIG. 5D, a polysilicon film 114 is formed on the nMIS region and the pMIS region. Furthermore, a resist 115 is formed on the polysilicon film 114, and a gate wiring pattern is formed on the nMIS region and the pMIS region by a lithography technique (a third lithography).

Figure 5E:
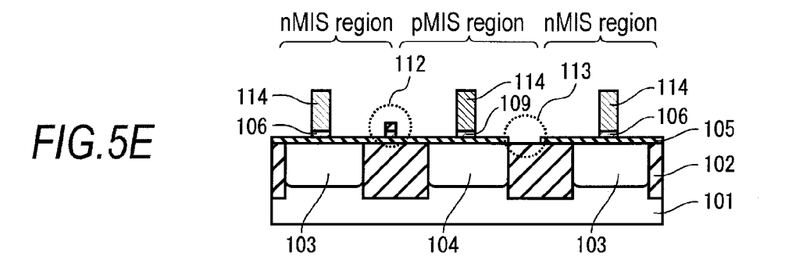

Next, as shown in FIG. 5E, using the resist 115 as a mask, an anisotropic etching over the polysilicon film 114 and a titanium nitride film 106 in the nMIS region and the polysilicon film 114 and the tungsten film 109 in the pMIS region is performed, and the resist 115 is removed to finish a gate structure.

A gate electrode of the nMIS has a laminated structure of the titanium nitride film 106 and the polysilicon film 114. On the other hand, a gate electrode of the pMIS has a laminated structure of the tungsten film 109 and the polysilicon film 114. Thus, a gate structure using different materials for the nMIS and the pMIS is finished.

According to the comparative-example method, between the first lithography for opening only the pMIS region and the second lithography for opening only the nMIS region, an alignment shift is generated due to a precision limitation of the lithography. The alignment shift is generated in the case where the resist positions in the first lithography and the second lithography overlap each other or separated from each other.

In the case where the resist positions overlap, the titanium nitride film 106 and the silicon nitride film 107 overlap each other at a circular portion 116 as shown in a broken line of FIG. 5C. When the polysilicon film 114 is deposited as shown in FIG. 5D, a height at the portion is increased more greatly than in the other portions. As a result, the focus precision in a third lithography might be deteriorated, and a residue 112 might be generated by an insufficiently etching through the anisotropic etching for forming a gate structure.

On the other hand, in the case where the resist positions are separated, an excessively etched portion is remained at a circular portion 117 as shown in a broken line of FIG. 5C, thereby generating a step portion. As a result, the focus precision in the third lithography might be deteriorated, and a disconnection 113 might be generated by the excessive etching.

In the comparative-example method, in the first lithography and the second lithography, an alignment shift of the mask position is caused. As a result, at a wiring step in the third lithography, the residue or the disconnection might be generated. In order to solve the problem, the inventor supposed embodiments according to the invention which will be described below. The embodiments will be described below with reference to the drawings.

First Embodiment

FIGS. 1A to 2D are sectional views showing a process for forming a gate electrode of a CMISFET according to a first embodiment of the invention.

Figure 1A:
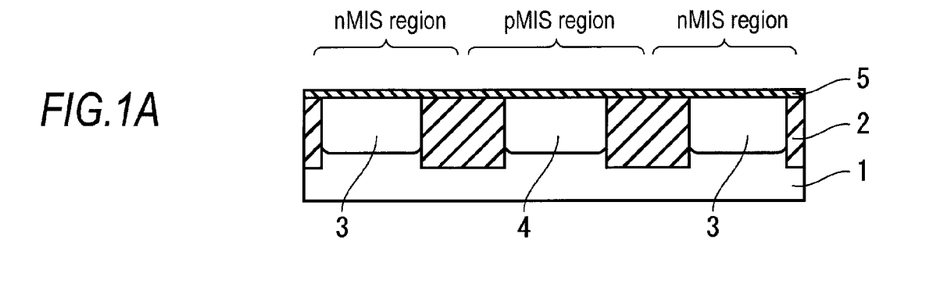
FIGS. 1A to 1D illustrate a method for manufacturing a semiconductor device according to a first embodiment of the present invention.

First of all, as shown in FIG. 1A, an element region insulated by an element isolating region 2 such as an STI is formed on a main surface of a silicon substrate 1, that is, a p well 3 is formed in an nMIS region and an n well 4 is formed in a pMIS region. The p and n wells may be formed to be deeper than the element isolating region 2. Then, a gate insulating film 5 is formed on the p and n wells 3 and 4 or the whole main surface of the silicon substrate 1. For example, as the gate insulating film 5, an insulating film, such as a hafnium oxide film, a hafnium oxynitride film and a hafnium silicate nitride film, which has a higher dielectric constant than a silicon oxide film or a silicon oxynitride film is used. The high-dielectric constant insulating film may be formed on the silicon oxide film to be used as a laminated-layer gate insulating film, and may be directly formed on the silicon substrate 1 to be used as a single-layer gate insulating film.

In the embodiment, the gate insulating film 5 is formed in a laminated-layer structure by forming the silicon oxide film through a thermal oxidation process or a radical oxidation process, and by forming the hafnium oxide film thereon through an MOCVD (Metal Organic Chemical Vapor Deposition) process.

Figure 1B:
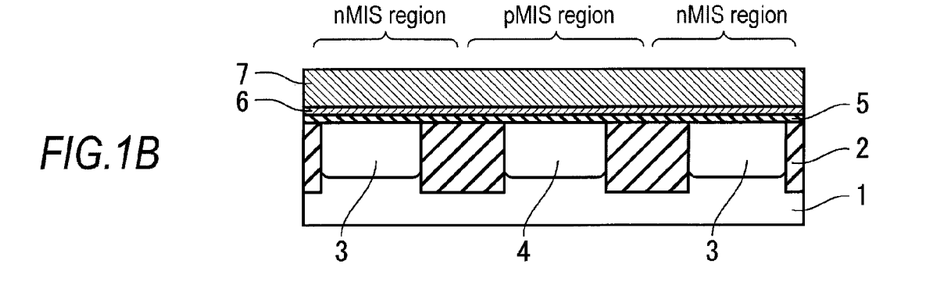

Next, as shown in FIG. 13, a metal gate electrode material, such as a titanium nitride film 6, for the nMIS is formed in a thickness of 20 nm on the gate insulating film 5, and a first polysilicon film 7 is formed on the titanium nitride film 6 in a thickness of 100 nm.

Figure 1C:
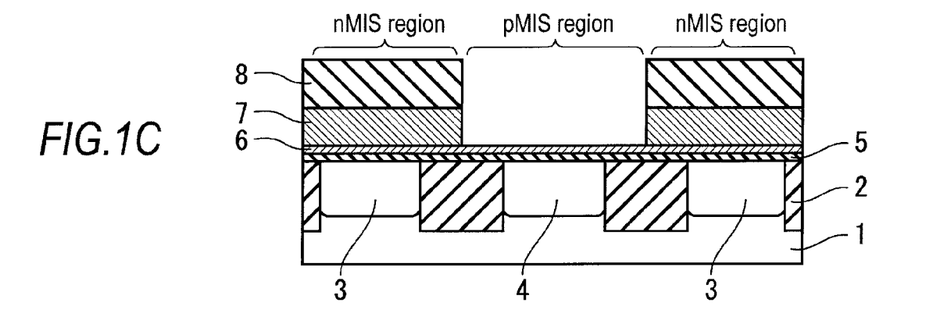

Subsequently, as shown in FIG. 1C, the first polysilicon film 7 is coated with a resist 8, and the resist 8 is selectively opened at the pMIS region by a lithography technique. The first polysilicon film 7 on the pMIS region is removed 8 by an etching technique such as RIE (Reactive Ion Etching) using the opened resist as a mask.

Figure 1D:
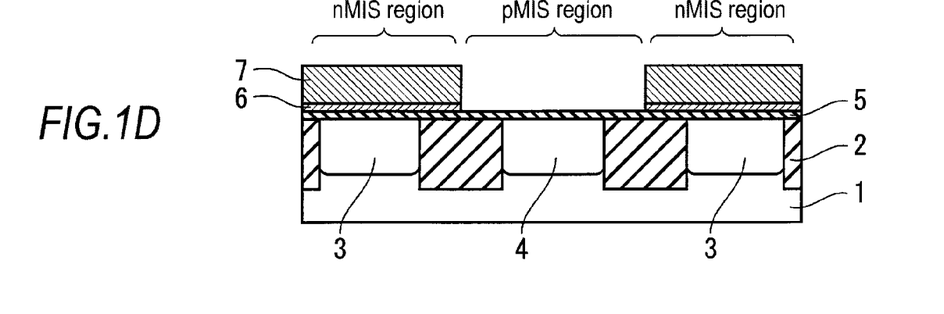

Then, as shown in FIG. 1D, the resist 8 is removed using a solvent, and the titanium nitride film 6 on the pMIS region is removed by etching using the first silicon film 7 as a mask. At this time, the gate insulating film 5 is not removed but left.

As an etching treatment for the titanium nitride film 6, it is more preferable to use a wet etching as compared with the case using a plasma etching such as the RIE to suppress an influence on the gate insulating film 5.

Figure 2A:
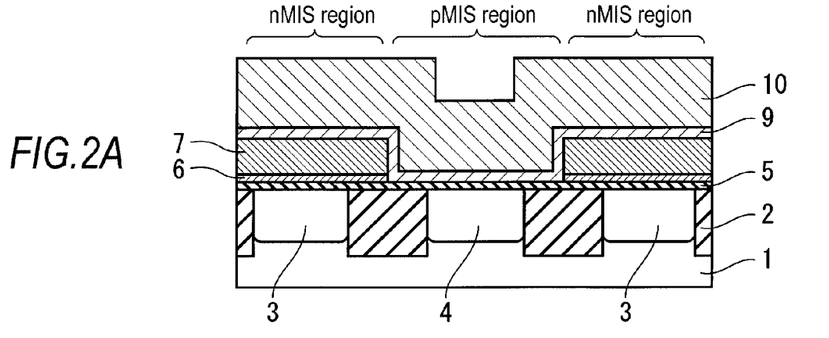
FIGS. 2A to 2D illustrate the method according to the first embodiment.

Next, as shown in FIG. 2A, next, a metal gate electrode material, such as a tungsten film 9, for the pMIS is formed in a thickness of 20 nm on the gate insulating film 5 in the pMIS region and the polysilicon film 7 in the nMIS region, and a second polysilicon film 10 is formed in a thickness of 200 nm on the tungsten film 9. The thickness of the second polysilicon film 10 may be adjusted to obtain a desirable flatness at a CMP step to be performed immediately thereafter.

In a portion in which the tungsten film 9 and the second polysilicon film 10 are provided in contact with each other, they react to each other when a heat treatment is performed at a subsequent step and tungsten silicide is thus formed. In the case where a device performance is not particularly influenced, they may be maintained without performing the heat treatment. When the device performance might be considered to be influenced, the reaction may be prevented by forming a barrier metal, such as a tungsten nitride film and a tantalum nitride film, in a thickness of approximately several nm between the tungsten film 9 and the second polysilicon film 10.

Figure 2B:
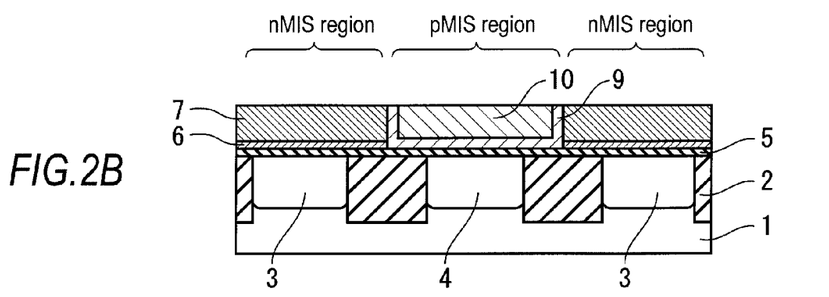

Subsequently, as shown in FIG. 2B, a flattening by a CMP is performed. In this case, polishing is executed until at least the second polysilicon film 10 and the tungsten film 9 are removed in the nMIS region, and the flattening is performed so that upper surfaces of the first polysilicon film 7 on the nMIS region and the second polysilicon film 10 on the pMIS region are on the same level. As a polishing material, a material capable of polishing the second polysilicon film 10 and the tungsten film 9 at an equal speed is preferable.

The flattening process may be performed in two-steps. That is, the second polysilicon film 10 is polished using the tungsten film 9 as a stopper, and then, the tungsten film 9 is polished using the first polysilicon film 7 as a stopper.

After the CMP has been performed, a laminated structure including the gate insulating film 5, the titanium nitride film 6 and the first polysilicon film 7 is formed on the nMIS region, and a laminated structure including the gate insulating film 5, the tungsten film 9 and the second polysilicon film 10 is formed on the pMIS region. The thicknesses of both the laminated structures are adjusted to be almost equal to each other.

Figure 2C:
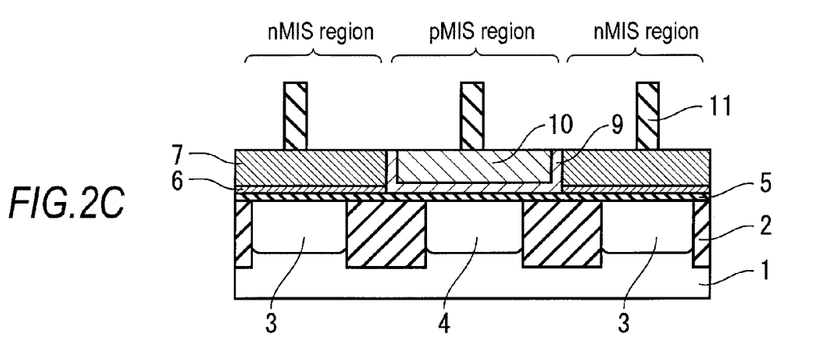

Then, as shown in FIG. 2C, a resist 11 is deposited, and the gate structures of the nMIS and pMIS are patterned by a lithography technique.

Figure 2D:
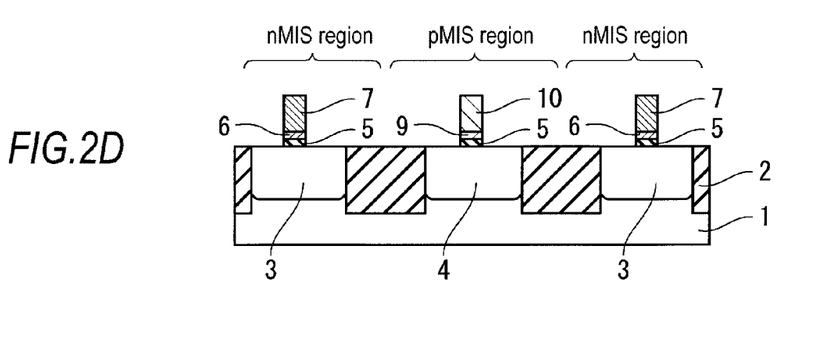

Subsequently, as shown in FIG. 2D, an anisotropic etching is performed over the second polysilicon film 10, the tungsten film 9 and the gate insulating film 5 in the pMIS region and the first polysilicon film 7, the titanium nitride film 6 and the gate insulating film 5 in the nMIS region, by use of the resist 11 a mask, and then, the resist 11 is removed so that a gate structure is finished.

According to the embodiment, the following advantages can be obtained. Both of the nMIS and pMIS regions are flattened by the CMP after the metal gate electrode materials have been formed respectively on both regions. As a result, a defect caused by the mask position shift in the lithography is prevented from being occurred.

Although the HfO film is used as the high-dielectric-constant insulating film of the gate insulating film 5 in the embodiment, the other material, such as an HfON film, a Zro film, a ZrON film, a HfSiO film, an HfSiON film, a ZrSiO film, a ZrSiON film, an HfZrO film, an HfZrON film, an HfZrSiO film, an HfZrSiON film, an HfAlSiON film and a ZnAlSiON film, may be used.

Although the tungsten film and the titanium nitride film are used as the metal gate electrode materials in the embodiment, other metal materials, such as Ru, RuO, NiSi, PtTiN, TaC, TaN, Mo, W, WN and PtSi, may be used.

Figure 6A:
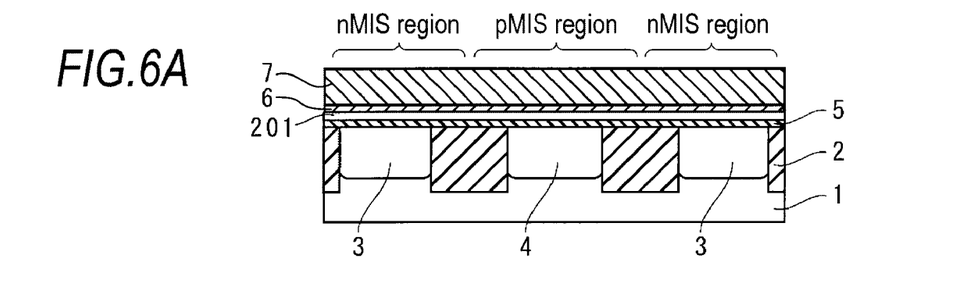
FIGS. 6A to 6D illustrate the method according to the first embodiment.
Figure 6B:
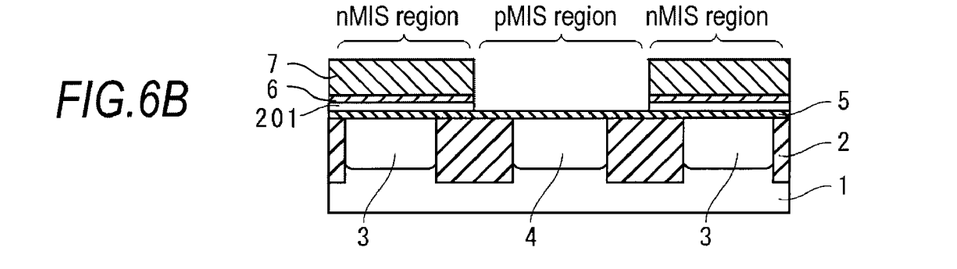

In the embodiment, a step of forming a cap film may be added. For example, when the nMIS metal gate electrode material is formed as shown in FIG. 1B, an nMIS cap film 201 may be formed on the gate insulating film 5, and the titanium nitride film 6 may be formed thereon as shown in FIG. 6A. In this case, an opening process in the pMIS region shown in FIG. 1C is performed to remove also the nMIS cap film 201 as shown in FIG. 6B.

Figure 6C:
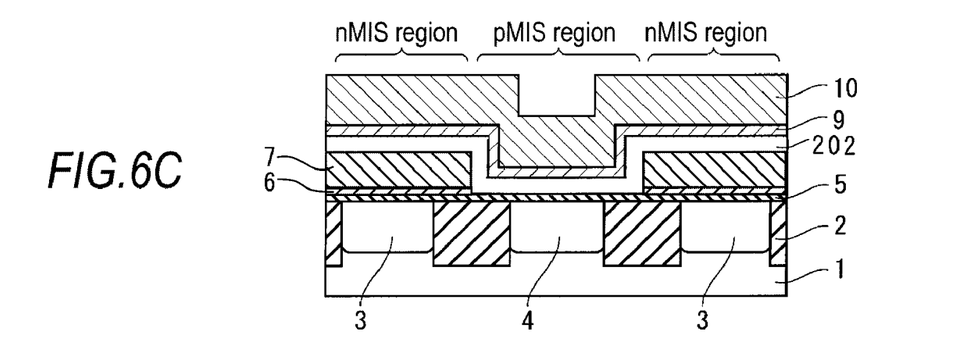
Figure 6D:
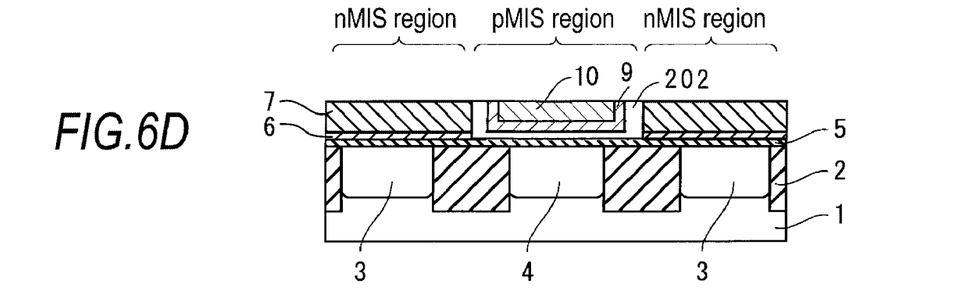

For example, when the pMIS metal gate electrode material is formed in the pMIS region as shown in FIG. 2A, a pMIS cap film 202 may be formed on the gate insulating film 5 and on the polysilicon film 7, and the tungsten film 9 may be formed thereon as shown in FIG. 6C. In this case, a flattening process shown in FIG. 2B is performed to remove the pMIS cap film 202 in the nMIS region as shown in FIG. 6D.

As a material for the nMIS cap film 201 and the pMIS cap film 202, for example, one or plural film of La, Al, Sc, Sr, Er, Mn, Mg, Tb, Yb, Y, Dy, Pt, W, Ru, Ta and C may be used. One or both of the nMIS cap film and the pMIS cap film may be formed.

In the embodiment, the polysilicon film is formed on the metal gate electrode to form a silicide film on the polysilicon film at a subsequent step to reduce a resistance. When the low-resistance material is used or when a low resistance can be realized only by the metal gate electrode itself, the polysilicon film may be omitted.

Second Embodiment

Next, description will be given to a method for manufacturing a CMISFET according to a second embodiment of the invention. In the embodiment, when the flattening is performed to process upper surfaces of a first polysilicon film on an nMIS region and a second polysilicon film on a pMIS region to be the same level, an etchback technique is used in place of the CMP flattening technique that is used in the first embodiment. The other manufacturing processes, the materials and structures of films are substantially same as those in FIG. 2A and previous drawings according to the first embodiment, description of repetitive portions will be omitted.

Figure 3A:
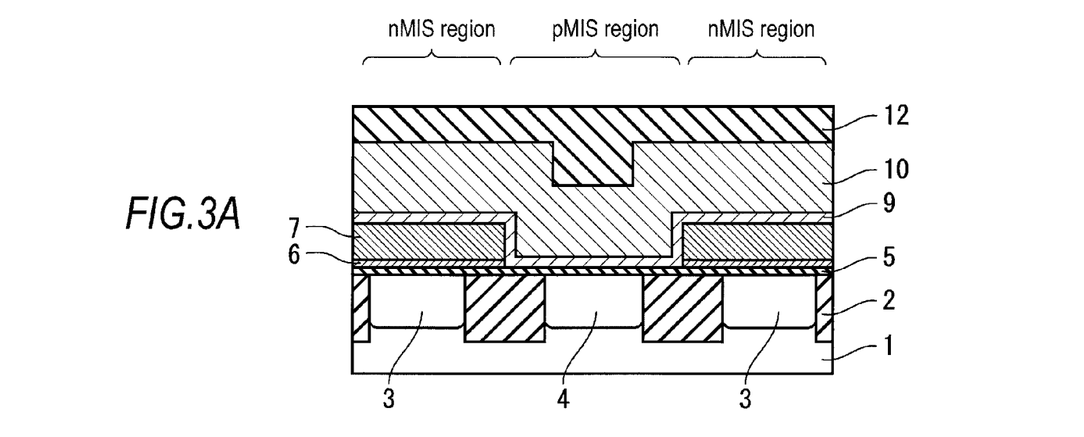
FIGS. 3A to 3C illustrate a method for manufacturing a semiconductor device according to a second embodiment of the present invention.
Figure 3B:
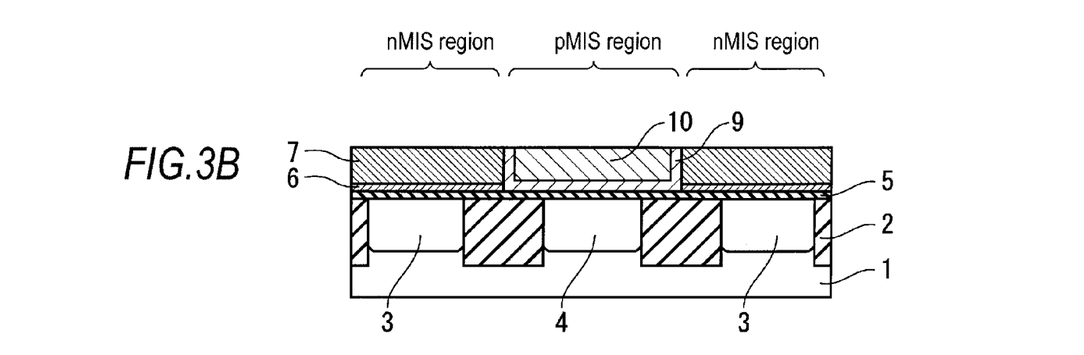

After a second polysilicon film 10 is formed, a resist 12 is formed on the second polysilicon film 10 by a coating method, for example, as shown in FIG. 3A. Here, the resist 12 is formed to have a flat top surface. Subsequently, as shown in FIG. 3B, the resist 12, the second polysilicon film 10 and a tungsten film 9 are flattened by the etchback technique.

For example, in the etchback technique, the resist 12 is formed to have a flat top surface, and an etching condition is adjusted so that etching rates for the resist 12, the second polysilicon film 10 and the tungsten film 9 are substantially equal by selecting an etching gas.

Figure 3C:
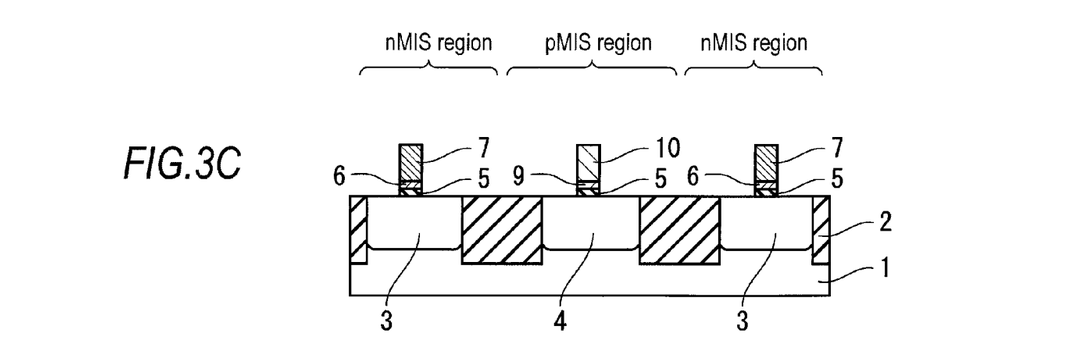

Then, as shown in FIG. 3C, patterning for gate structures of the nMIS and the pMIS is performed and the second polysilicon film 10, the tungsten film 9 and a gate insulating film 5 in the pMIS region and a first polysilicon film 7, a titanium nitride film 6 and the gate insulating film 5 in the nMIS region are subjected to anisotropic etching to finish a gate structure.

Also in the second embodiment, the same advantages as those in the first embodiment can be obtained. Similarly to the first embodiment, the step of forming a cap film may be added.

Although the p well 3 and the n well 4 are formed to be shallower than the element isolating region 2 in the second embodiment, the p well 3 and the n well 4 may be formed to be deeper than the element isolating region 2 as similar to the first embodiment.

The invention is not restricted to the embodiments but various changes can be made without departing from the scope of the invention. For example, while the first metal gate electrode material for the N type MISFET is formed earlier than the second metal gate electrode material for the P type MISFET in the embodiment, the order may be reversed to form the metal gate electrode material for the P type MISFET earlier.

What is claimed is:

1. A method for manufacturing a semiconductor device, the method comprising:

forming a first region and a second region in a semiconductor substrate by forming an element isolation region;

forming an insulating film on the semiconductor substrate in the first region and the second region;

forming a first metal film on the insulating film in the first region and in the second region;

removing the first metal film in the second region;

forming a second metal film on the first metal film in the first region and on the insulating film in the second region;

flattening top surfaces in the first region and the second region by performing a flattening process so that a top surface of the first metal film is flush with a top surface of the second metal film; and patterning the first metal film and the insulating film in the first region into a first gate structure, and patterning the second metal film and the insulating film in the second region into a second gate structure.

2. The method according to claim 1, wherein the flattening process is performed to remove the second metal film in the first region.

3. The method according to claim 1, wherein the first region includes an nMIS region in which an nMIS transistor is formed, wherein the second region includes a pMIS region in which a pMIS transistor is formed, wherein the first metal film includes an nMIS gate metal, and wherein the second metal film includes a pMIS gate metal.

4. The method according to claim 1, wherein the flattening process includes: performing a CMP process.

5. The method according to claim 1, wherein the flattening process includes: forming a resist over the semiconductor substrate; and performing an etchback process:

6. The method according to claim 1, wherein the insulating film includes a high permittivity insulating film.

7. The method according to claim 1, wherein the first metal film includes a plurality of metal films.

8. The method according to claim 7, wherein the plurality of metal films include materials different from one another.

9. The method according to claim 1, wherein the second metal film includes a plurality of metal films.

10. The method according to claim 9, wherein the plurality of metal films include materials different from one another.

11. A method for manufacturing a semiconductor device, the method comprising:
forming a first region and a second region in a semiconductor substrate by forming an element isolation region;
forming an insulating film on the semiconductor substrate;
forming a first cap film on the insulating film;
forming a first metal film on the first cap film;
removing the first metal film and the first cap film in the second region;
forming a second metal film on the first metal film in the first region and on the insulating film in the second region;
flattening top surfaces in the first region and the second region by performing a flattening process so that a top surface of the first metal film is flush with a top surface of the second metal film; and
patterning the first metal film and the insulating film in the first region into a first gate structure, and patterning the second metal film and the insulating film in the second region into a second gate structure.

12. The method according to claim 11 further comprising:
forming a second cap film on the first metal film in the first region and on the insulating film in the second region, wherein the second metal film is formed on the second cap film, and wherein the flattening process is performed to remove the second cap film in the first region.

13. A method for manufacturing a semiconductor device, the method comprising:
forming a first region and a second region in a semiconductor substrate by forming an element isolation region;
forming an insulating film on the semiconductor substrate;
forming a first metal film on the insulating film;
removing the first metal film in the second region;
forming a cap film on the first metal film in the first region and on the insulating film in the second region;
forming a second metal film on the cap film;
flattening top surfaces in the first region and the second region by performing a flattening process so that the cap film is removed in the first region and so that a top surface of the first metal film is flush with a top surface of the second metal film; and
patterning the first metal film and the insulating film in the first region into a first gate structure, and patterning the second metal film and the insulating film in the second region into a second gate structure.

14. The method according to claim 11, wherein the first cap film includes at least one material selected from a group consisting of:
La; Al; Sc; Sr; Er; Mn; Mg; Tb; Yb; Y; Dy; Pt; W; Ru; Ta; and C.

15. The method according to claim 12, wherein the first cap film includes at least one material selected from a group consisting of:
La; Al; Sc; Sr; Er; Mn; Mg; Tb; Yb; Y; Dy; Pt; W; Ru; Ta; and C, and
wherein the second cap film includes at least one material selected from a group consisting of:
La; Al; Sc; Sr; Er; Mn; Mg; Tb; Yb; Y; Dy; Pt; W; Ru; Ta; and C.

16. The method according to claim 13, wherein the cap film includes at least one material selected from a group consisting of:
La; Al; Sc; Sr; Er; Mn; Mg; Tb; Yb; Y; Dy; Pt; W; Ru; Ta; and C.

17. The method according to claim 1, wherein the first gate structure and the second gate structure are patterned after the flattening process is performed.

18. The method according to claim 1, wherein the first gate structure and the second gate structure are simultaneously patterned.

19. The method according to claim 1, wherein the first gate structure and the second gate structure are patterned so that the semiconductor substrate is exposed except for regions corresponding to the first gate structure and the second gate structure.

* * * * *